United States Patent
Dwyer et al.

(10) Patent No.: US 6,571,211 B1
(45) Date of Patent: May 27, 2003

(54) VOICE FILE HEADER DATA IN PORTABLE DIGITAL AUDIO RECORDER

(75) Inventors: John J. Dwyer, Stratford, CT (US); David K. Godin, Wilton, CT (US); Stephen Rothschild, Ridgefield, CT (US); John J. Pawlowski, Shelton, CT (US)

(73) Assignee: Dictaphone Corporation, Stratford, CT (US)

( * ) Notice: Subject to any disclaimer, the term of this patent is extended or adjusted under 35 U.S.C. 154(b) by 0 days.

(21) Appl. No.: 09/190,199

(22) Filed: Nov. 12, 1998

Related U.S. Application Data

(60) Provisional application No. 60/066,748, filed on Nov. 21, 1997.

(51) Int. Cl.[7] .............................................. G06F 17/40
(52) U.S. Cl. ...................................... 704/270; 707/530
(58) Field of Search .............................. 704/201, 270, 704/275; 455/412; 360/32; 707/530

(56) References Cited

U.S. PATENT DOCUMENTS

| | | | |
|---|---|---|---|
| 4,319,337 A | 3/1982 | Sander et al. ................ 345/751 |
| 4,837,830 A | * 6/1989 | Wrench et al. .............. 704/238 |
| 5,033,077 A | 7/1991 | Bergeron et al. ........ 379/88.12 |
| 5,146,439 A | 9/1992 | Jachmann et al. ....... 369/25.01 |
| 5,216,744 A | 6/1993 | Alleyne et al. ............. 704/200 |
| 5,265,075 A | 11/1993 | Bergeron et al. ........ 369/25.01 |
| 5,294,229 A | 3/1994 | Hartzell et al. ............. 434/336 |
| 5,398,220 A | 3/1995 | Barker ..................... 369/29.02 |
| 5,423,034 A | 6/1995 | Cohen-Levy et al. ......... 707/10 |
| 5,444,768 A | 8/1995 | Lemaire et al. ............... 379/68 |
| 5,477,511 A | 12/1995 | Englehardt ............... 369/25.01 |
| 5,481,645 A | 1/1996 | Bertino et al. .............. 704/270 |
| 5,491,774 A | * 2/1996 | Norris et al. ............... 704/270 |
| 5,548,566 A | 8/1996 | Barker ..................... 369/29.02 |
| 5,568,538 A | 10/1996 | Tamir et al. ................. 455/412 |
| 5,729,734 A | 3/1998 | Parker et al. .................. 707/9 |
| 5,742,736 A | 4/1998 | Haddock .................... 704/270 |
| 5,774,841 A | 6/1998 | Salazar et al. .............. 704/225 |
| 5,799,280 A | 8/1998 | Degen et al. ............... 704/276 |
| 5,812,882 A | 9/1998 | Raji et al. ..................... 710/72 |
| 5,818,800 A | 10/1998 | Barker ..................... 369/29.02 |
| 5,839,108 A | * 11/1998 | Daberko et al. ............ 704/270 |
| 5,898,916 A | 4/1999 | Brelawsky .................. 455/412 |
| 5,903,871 A | * 5/1999 | Terui et al. ................. 704/500 |

(List continued on next page.)

OTHER PUBLICATIONS

Lisa Joy Stifelman, "VoiceNotes: An Application for a Voice–Controlled Hand–Held Computer", Jun. 1992, MIT Master's Thesis.

*Primary Examiner*—Marsha D. Banks-Harold
*Assistant Examiner*—Donald L. Storm
(74) *Attorney, Agent, or Firm*—Howrey Simon Arnold & White, LLP; Anthony L. Meola

(57) ABSTRACT

A portable audio recorder stores voice information files in the form of digital data. Header data is associated with each voice information file. The header data includes the name of the person who dictated the voice information file and the serial number of the recorder unit itself. This information may be used in connection with management of the voice information files in the recorder or after the files are transferred to another device such as a personal computer. The header data may also include the serial number of the recorder and a work facility location to which the file pertains. The user of the recorder may be permitted to select a format for the header data from among a plurality of pre-stored formats. Specific transaction data may be downloaded to the recorder, and used to build a header for a voice file, which is then uploaded with the header to another device.

19 Claims, 9 Drawing Sheets

U.S. PATENT DOCUMENTS

| | | | |
|---|---|---|---|
| 5,982,857 A | 11/1999 | Brady | 379/88.19 |
| 5,986,568 A * | 11/1999 | Suzuki et al. | 340/825.52 |
| 6,038,199 A | 3/2000 | Pawlowski et al. | 369/29.02 |
| 6,122,614 A | 9/2000 | Kahn et al. | 704/235 |
| 6,175,822 B1 | 1/2001 | Jones | 704/270 |
| 6,282,154 B1 | 8/2001 | Webb | 704/275 |
| 6,308,158 B1 | 10/2001 | Kuhnen et al. | 704/275 |
| 6,321,129 B1 | 11/2001 | D'Agosto, III | 700/94 |
| 6,356,754 B1 | 3/2002 | Onozawa et al. | 455/412 |

\* cited by examiner

DIGITAL PORTABLE RECORDER

(BLOCK DIAGRAM)

VOICE FILE HEADER DATA IN PORTABLE DIGITAL AUDIO RECORDER

CROSS-REFERENCE TO RELATED APPLICATION

This application claims priority to provisional patent application serial No. 60/066,748, filed Nov. 21, 1997.

BACKGROUND OF THE INVENTION

Pocket-sized voice recorders are widely used as a convenient way to take notes, store information and create documents in audio form. Among other applications, the recorded information may be transcribed to present the information in written form.

In recent years, compact audio recorders have been proposed in which the audio information is stored as digital data in a solid state memory. In some cases, a removable memory card is used as the storage medium.

Prior art embodiments of compact digital audio recorders have, to date, fallen short in terms of making it convenient for the user to manage the audio files stored in the recording device or removable recording medium. The prior art has also failed to provide for satisfactory integration of portable digital audio recorders with other information management devices, such as personal computers and computer networks. Other subjects not adequately addressed by the prior art are how to conveniently transfer digital audio files from portable recorders to other devices such as PC's, and how to identify and manage the audio files after transfer from the portable recorder to a PC.

OBJECTS AND SUMMARY OF THE INVENTION

It is accordingly an object of the invention to provide for convenient management of audio information stored in a portable digital audio recorder or transferred from such a recorder to a personal computer.

According to an aspect of the invention, there is provided a method of operating a portable digital audio recorder, including the steps of storing a voice data file in a memory device included in the portable digital recorder, the voice data file representing sounds spoken by a user of the recorder, generating data which identifies the user of the recorder, and storing header data in association with the voice data file, the header data including data which identifies the user of the recorder. The data-generating step may include automatically recognizing the user's voice on the basis of the sounds spoken by the user. Alternatively, the data-generating step may include receiving data signals input into the recorder by the user.

According to other aspects of the invention, the header data stored in association with the voice data file may include data which uniquely identifies the particular recording unit and/or a work location ("occupational establishment") with which the user of the recorder is associated.

According to another aspect of the invention, there is provided a portable digital audio recorder, including a housing shaped and sized to fit in a user's hand, a microphone mounted to the housing for generating an analog voice signal which represents sounds spoken by a user of the recorder, circuitry mounted in the housing for converting the analog voice signal into digital voice data, a memory device in the housing for storing the digital voice data in the form of a voice data file, and circuitry for generating data which identifies the user of the recorder, wherein the memory device stores header data in association with the voice data file and the header data includes the data generated by the above-mentioned data generating circuit.

Including author-identifying information in the voice file header data facilitates management of voice data files in a portable recorder that is shared by more than one user. Moreover, the author-identifying data, as well as the data which identifies the particular recording unit, is especially useful in connection with identifying and managing voice data files created in a portable recorder and subsequently transferred to a personal computer or a network of computers. When the author travels from one work location to another, as in the case of a physician who is associated with a number of different hospitals and/or clinics, management of voice data files using the portable recorder is enhanced by including in the header data a field which identifies the particular establishment to which the voice data file is pertinent.

According to a further aspect of the invention, there is provided a method of operating a portable digital audio recorder, the recorder including one or more memory devices, and the method including the step of storing header format data in the memory device(s), the header format data representing a plurality of header formats, selecting one of the plurality of header data formats, the method further including the steps of storing a voice data file in the memory device(s), the voice data file representing sounds spoken by a user of the recorder, generating header data in accordance with the selected header data format, and storing the generated header data in the memory device(s) in association with the voice data file. It may be the case that the header format data is stored in an embedded memory device in the recorder, whereas the voice data file and the header data in the selected format are stored in a removable memory device.

The latter aspect of the invention provides to the user the ability to pre-store and then select among a number of header data formats, which enhances flexibility in managing voice data files generated using the recorder.

According to still another aspect of the invention, there is provided a method of operating a voice data management system, where the system includes a portable digital voice recorder, a personal computer, and circuitry for interfacing the recorder to the personal computer so that data may be exchanged between the recorder and the personal computer, and wherein the method includes the steps of downloading transaction data from the personal computer to the recorder, storing a voice data file in the recorder, the voice data file representing sounds spoken by a user of the recorder, generating header data in the recorder, with the header data including at least some of the downloaded transaction data, storing header data in the recorder in association with the voice data file, and uploading the voice data file and the header data from the recorder to the personal computer.

It is to be understood that "transaction data" means data relating to a particular incident with respect to which the user of the recorder needs to generate a voice data file. Examples of such incidents are an accident to be investigated by an insurance adjuster who is the user of the portable recorder, or a medical procedure with respect to which a physician who uses the recorder is required to dictate an operative report or a post-op notes.

By downloading specific transaction data from a PC to a recorder, using the transaction data as header data for the voice file generated in the recorder, and then uploading the voice data file and the header data to the PC, it can be assured that the PC, or a data network of which it is a part, properly handles the relevant voice data file.

Other objects, features and advantages of the invention will be become apparent from the subsequent more detailed description of preferred embodiments.

DESCRIPTION OF PREFERRED EMBODIMENTS

Figure 1:
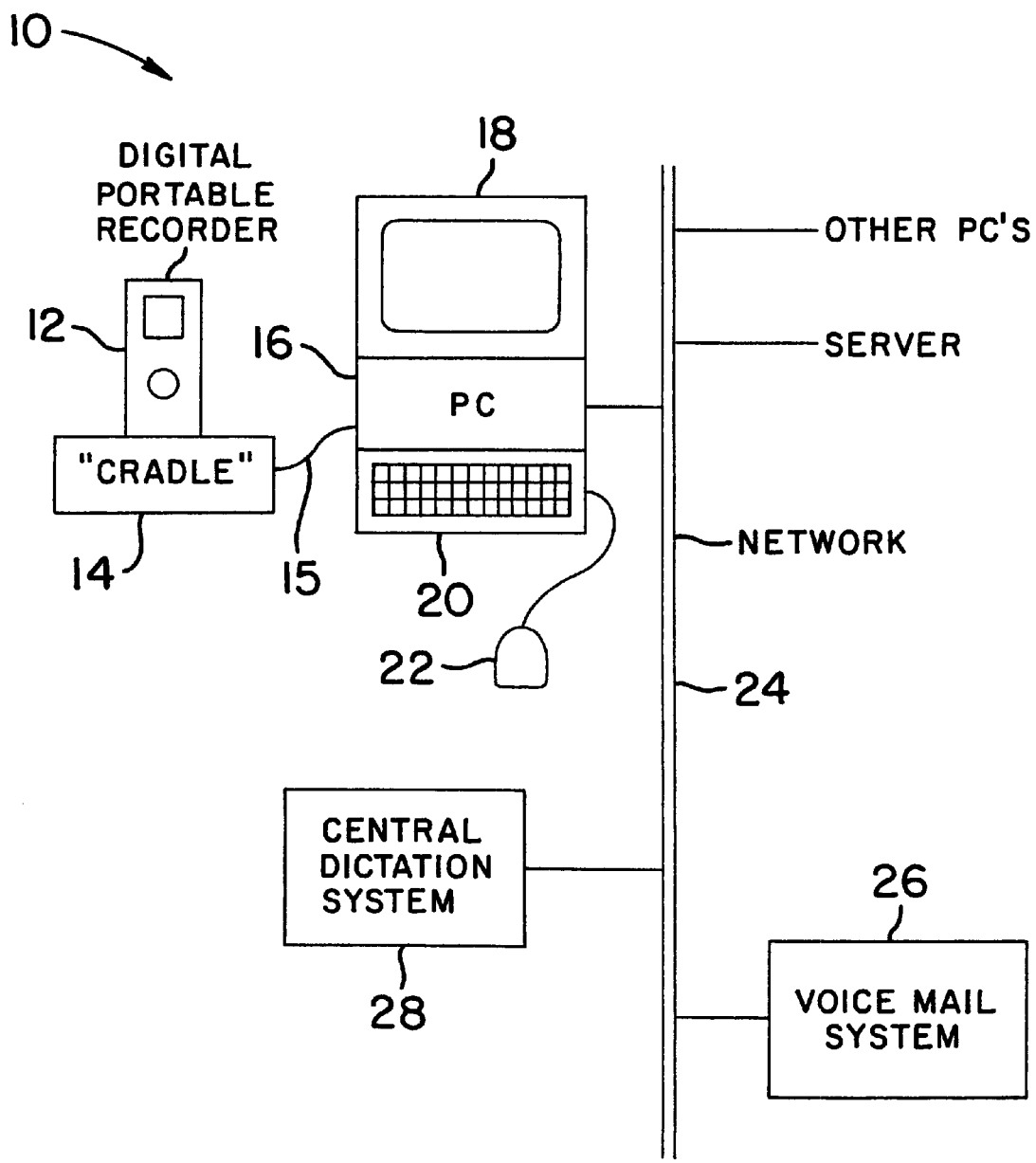
FIG. 1 is a block diagram of a voice data management system in which the present invention may be applied.

In FIG. 1, reference numeral 10 generally indicates a voice data management system in which the present invention may be applied. The voice data management system 10 includes a portable digital voice recorder 12 which is shown resting on a docking station or "cradle" 14. A cable 15 connects the cradle 14 to a personal computer 16. The cradle forms part of a signal path which permits the exchange of digital data between the portable recorder 12 and the PC 16.

The PC 16 is preferably of conventional construction, including a display 18, keyboard 20 and mouse 22. The PC 16 is programmed to interact with the recorder 12 interfaced to the PC 16 via the cradle 15. Among other functions, the PC 16 receives and stores voice data files transferred to the PC 16 from the recorder 12. Details of suitable software for controlling the PC 16 in connection with its interactions with the recorder 12 are set forth in co-pending patent application Ser. No. 09/190,196, filed Nov. 12, 1998, entitled "VOICE FILE MANAGEMENT IN PORTABLE DIGITAL AUDIO RECORDER," which has common inventors and a common assignee with the present application.

Also shown in FIG. 1 is a local area network (LAN) 24 which provides for data communication among the PC 16 and other system components, including other personal computers, a network server device, a voice mail system 26 and a central dictation system 28. Like the LAN 24, the other system components just enumerated may all be conventional items.

Figure 2:
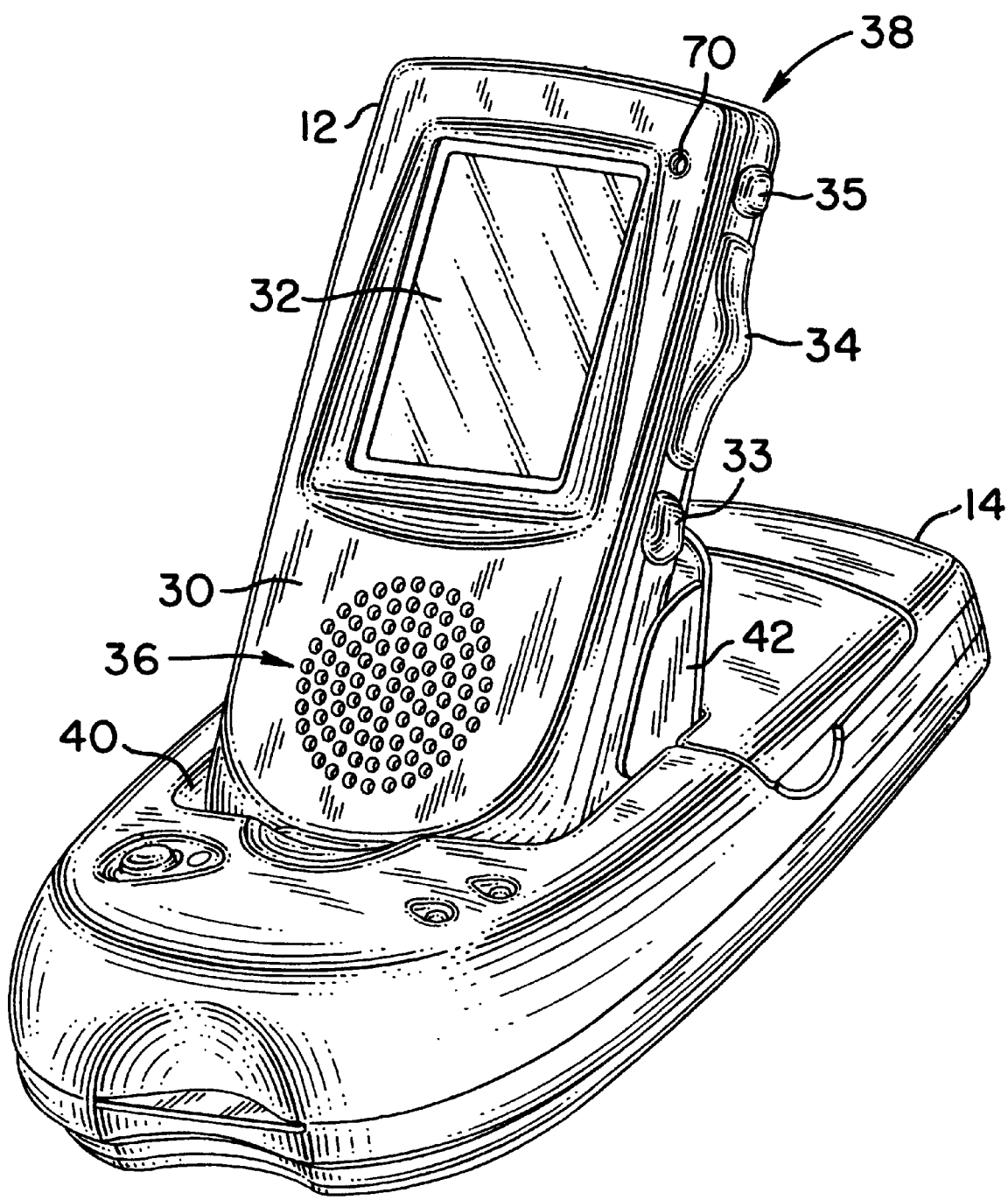
FIG. 2 is a perspective view of a portable digital voice recorder and a docking station which are part of the system of FIG. 1.

FIG. 2 is a perspective view showing some details of the portable recorder 12 and cradle 14. As seen in FIG. 2, the portable recorder 12 includes a housing 30, on which are mounted a display screen 32 and a slide switch 34. The recorder 12 may be like recorders disclosed in co-pending application Ser. No. 09/177,028, filed Oct. 22, 1998. The recorder 12 is preferably a very compact item, such that the housing 30 is shaped and sized to fit in the user's hand. The display screen 32 is preferably a touch screen which allows the user to interact with the recorder 12 in a manner similar to that employed in so-called "personal digital assistants". A stylus (not shown) may be provided with the recorder to aid in inputting user selections via the touch screen.

The slide switch 34 is used to control conventional functions provided in a portable voice recorder, such as "record", "play", "rewind", and "stop". The functioning of the slide switch preferably emulates the user interface provided by high-end tape-based dictation units, so that users familiar with conventional dictation practices can easily adapt to using the digital recorder described herein. Push buttons 33, 35 may provide additional functions, such as "fast forward" or "cue". Alternatively, one of the buttons may control backlighting for the screen 32.

Other salient features of the recorder 12 include a grille region 36 in the housing, provided to cover a speaker which is built into the recorder. The recorder 12 also includes a microphone which is not shown in FIG. 2, but is preferably installed at a corner 38 of the housing near the slide switch 34.

The recorder 12 rests in a recess 40 of the cradle 14 and reclines against a lid 42 for the recess 40. Provided within the recess 40 of the cradle 14, and not visible in FIG. 2, is a parallel data connection which mates with a corresponding connection in the base of the recorder housing 30. The recorder parallel connection also is not visible in the drawing.

Figure 3:
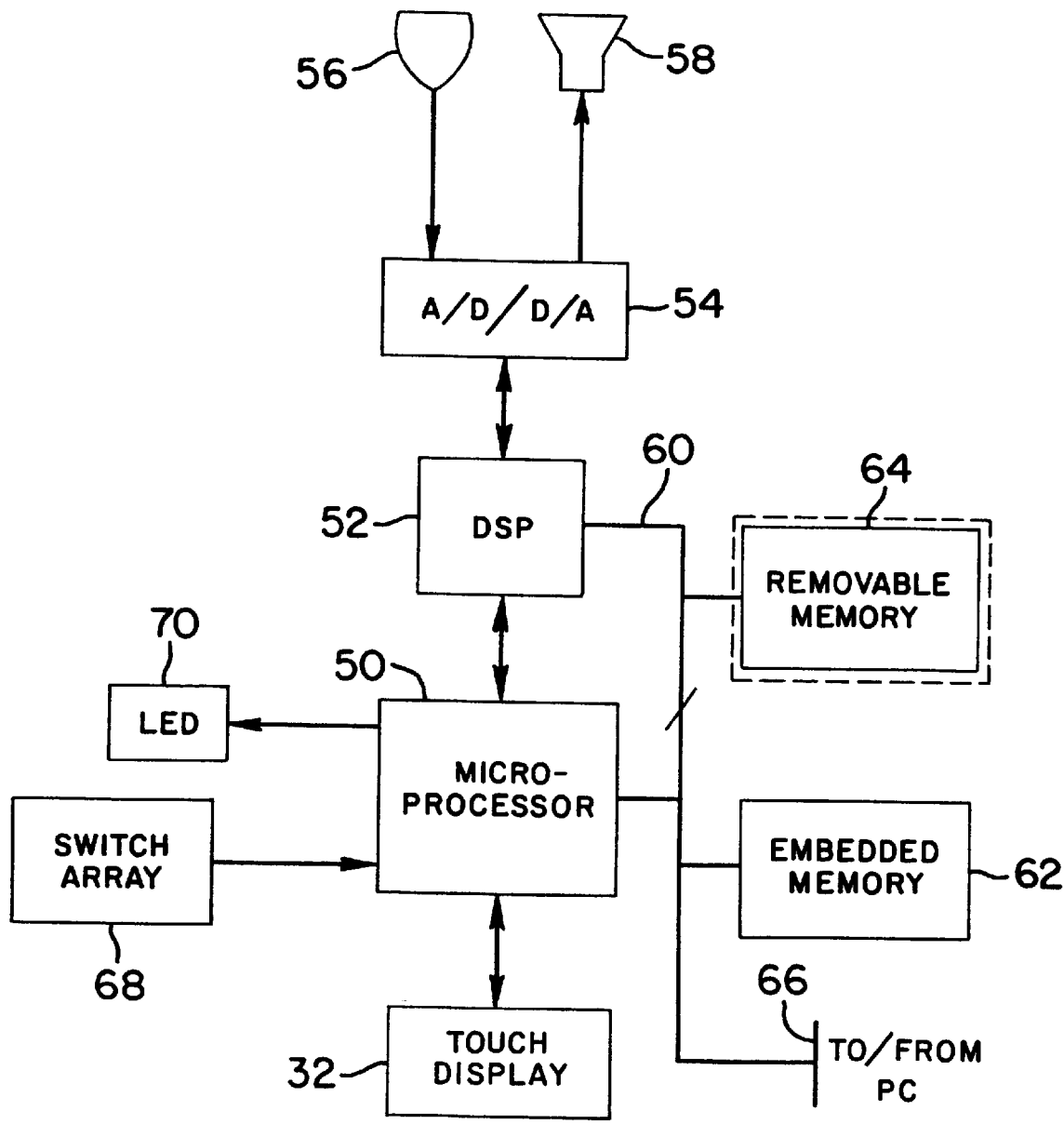
FIG. 3 is a block diagram representation of electrical and electronic components of the portable recorder of FIG. 2.

Electric and electronic components of the recorder 12 are illustrated in block diagram form in FIG. 3. It is to be understood that the components shown in FIG. 3 are mounted within or on the recorder housing 30 (FIG. 2).

Continuing to refer to FIG. 3, a microprocessor or microcontroller 50 is mounted within the recorder and controls operations of the recorder. The microprocessor 50 is connected to a digital signal processing circuit 52 and exchanges command and data messages with the DSP 52. The DSP 52 is, in turn, connected to a circuit 54 which performs analoq-to-digital and digital-to-analog signal conversion functions. The recorder also has a built-in microphone 56 and speaker 58 which are connected to the A/D and D/A circuit 54. (To simplify the drawing, signal conditioning circuits such as filters and amplifiers are not shown.) A multi-bit signal bus 60 interconnects the microprocessor 50 with the DSP 52 as well as an embedded memory device 62, a removable memory card 64, and the above-mentioned parallel data port 66 by which data may be exchanged with the personal computer. The removable memory card 64 may be used primarily for storing voice files and associated header data (to be described below), and the embedded memory 62 may be used primarily for program and working memory. However, these roles may be shared or reversed. The removable memory card preferably includes flash memory.

The microprocessor 50 is also interconnected with the above-mentioned touch screen 32, by which the microprocessor 50 provides information to the user of the recorder, and through which the user inputs information to the microprocessor 50. Also providing input to the microprocessor 50 is a switch array 68 which is actuatable by the user by means of the above-mentioned slide switch 34 (FIG. 2). Illustrated in both FIGS. 2 and 3 is a light emitting diode 70 which is selectively illuminated by the microprocessor 50 to indicate when voice recording is taking place.

According to a preferred embodiment of the invention, the portable recorder incorporates features and functions found in known personal digital assistant devices, in addition to voice recording and playback and voice file management capabilities as described herein. Thus, the recorder 12 may also function as an electronic address book, appointment book and calculator. The recorder 12 may also store to-do lists (with timed reminders) and may be used to generate and/or review voice mail and/or electronic text mail messages either generated in the recorder for forwarding via the personal computer or downloaded to the recorder from the PC.

It will be understood that the recorder also provides via the touch screen 32 a menu which allows the user to select among the functions provided by the recorder. It is, however, preferred that the user be allowed to access voice file recording and editing functions via the slide switch 34, and without resort to the menu. In addition, it is contemplated to allow the user to control recording, editing and playback functions via the touch screen, which also may be used to navigate among voice files and to select an existing voice file for playback and/or additional recording.

According to a preferred embodiment of the invention, a serial number which uniquely identifies the particular recorder unit is permanently stored in the embedded memory 62 of the recorder. The serial number may also be stored at a suitable location in the removable memory 64 in order to provide a "history" which indicates the recorder unit in which the removable memory 64 was installed. The serial number may be the same as a serial number printed on a sticker or otherwise affixed to the exterior of the recorder housing.

If, over a period of time, the removable memory 64 is loaded into a series of recorder units, it is preferable that a history of the recorder units be stored in the removable memory. For example, there may be stored in the memory 64 a sequential list of serial numbers of the recorder units, and the dates and times of loading and unloading of the removable memory in the respective recorder units.

As will be seen, the recorder unit serial number is to be included in header data associated with each voice file generated by the recorder and stored in either the removable memory 64 or the embedded memory 62. When a voice file generated in the recorder is transferred to another device, such as the PC 16 (FIG. 1), the header data is transferred along with the voice file, and the recorder unit serial number in the header data serves to identify the original source of the voice data file.

The present invention also provides for including in the voice file header a data item which indicates the author of the voice file.

If the recorder unit is to be used exclusively by one person, then that person's name may be permanently stored in the embedded memory 62 and included in the voice file header data at the same time and in the same manner as the unit serial number.

There are a number of ways in which the user's name may be entered into the memory 62. For example, each unit may be built to order, and the user's name entered into the embedded memory at the factory. However, it is likely to be more convenient to permit the user himself or herself to enter his or her name upon first taking delivery of the recorder unit. As part of a set-up procedure, the user may be prompted to enter his or her name, by means of a virtual keyboard displayed on the touch screen 32 (FIG. 2).

If the recorder unit is to be shared by more than one user, then the names of all users are stored in the embedded memory 62, and, in addition, the recorder unit carries out a procedure to establish the identity of the individual who is currently using the unit. According to one approach, each user may simply log in, by using the touch screen interface to enter alphabetic and/or numeric characters. According to an alternative procedure, voice (speaker) recognition software may be provided in the recorder unit to identify the current user on the basis of characteristics of the user's voice. If the latter procedure is to be employed, then the process of "setting up" the recorder unit for each user would include, in additional to entry of the user's name, prompting the user to speak a pre-determined word or set of words. The recorder unit would then extract the user's speech characteristics and store data indicative of the extracted characteristics. The stored characteristic data would later be utilized to determine the identity of a person who subsequently inputs voice files for storage in the recorder unit.

Additional details of the operation of the recorder unit illustrated in FIGS. 2 and 3 will now be described with reference to FIGS. 4A and 4B.

Figure 4A:
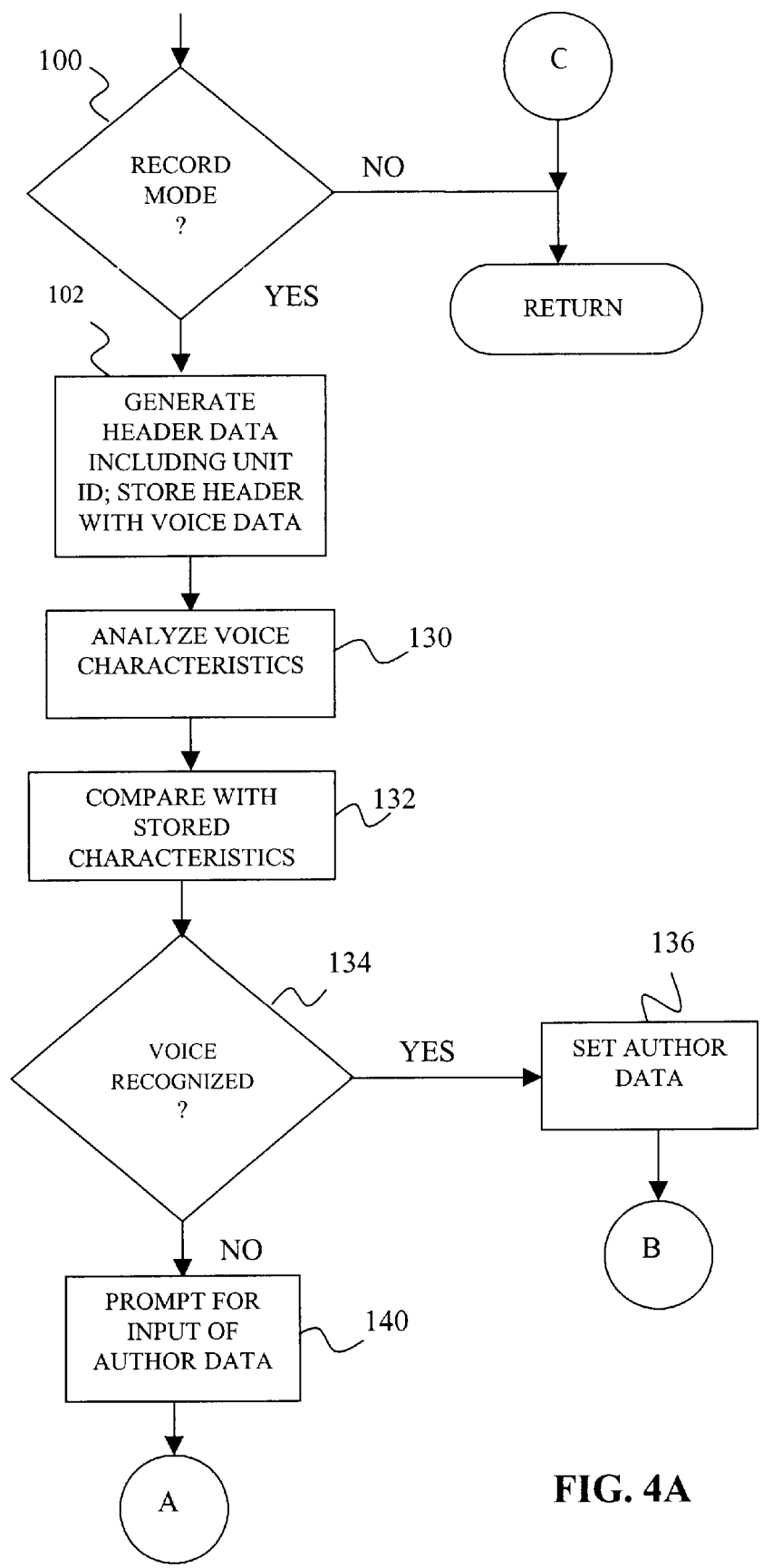
FIGS. 4A and 4B together form a flow chart which illustrates software provided in accordance with the invention to control operation of the portable recorder of FIGS. 2 and 3.
Figure 4B:
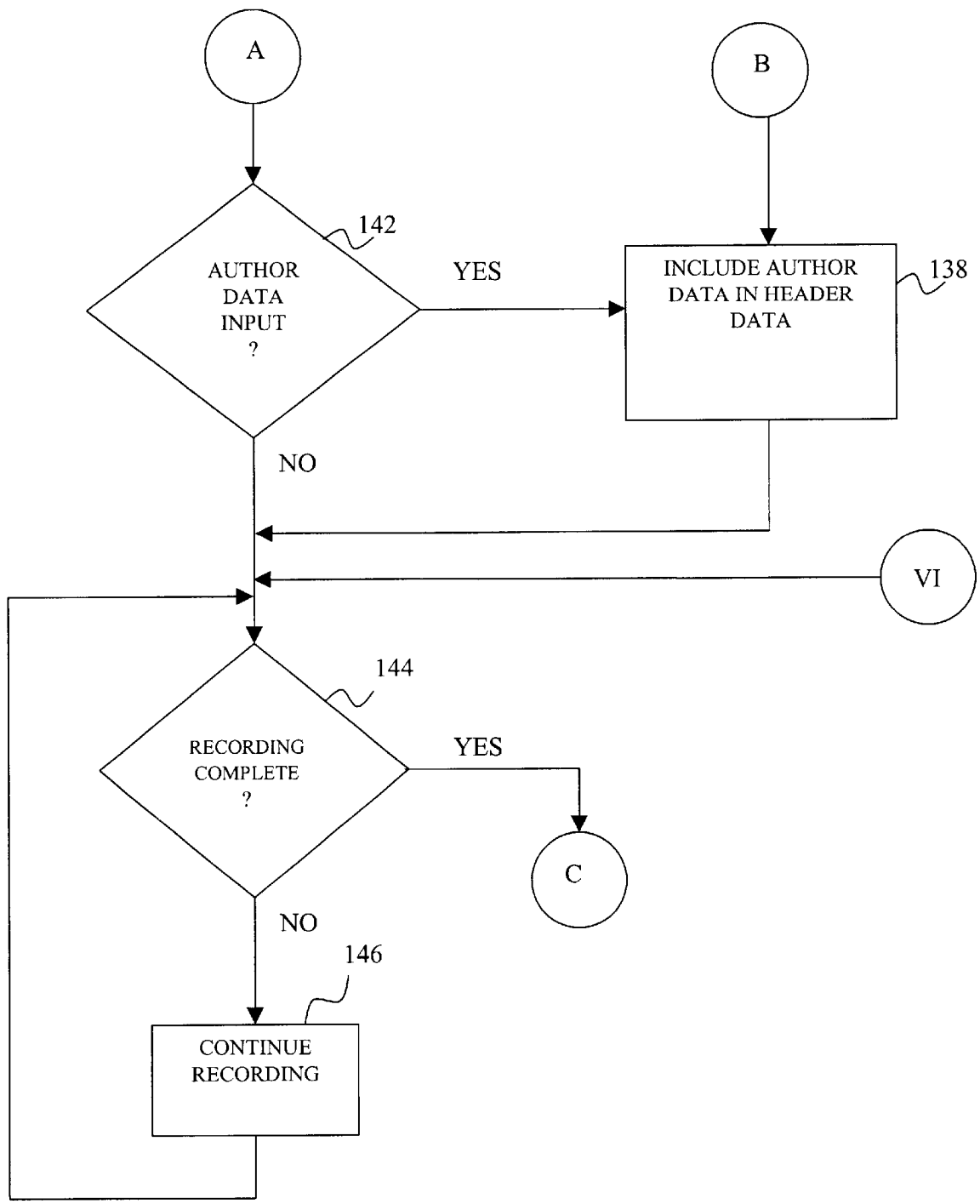

FIGS. 4A and 4B together form a flow chart which illustrates software stored in the recorder unit to control operation of the unit. Initially, at step 100 in FIG. 4A, it is determined whether a recording mode is accessed, either via the touch screen or by using the slide switch. If a positive determination is made at step 100, then step 102 follows. At step 102, a new voice data file is created, and header data for the new voice data file is generated. Both the new voice data file and the corresponding header data are then stored in memory, preferably the removable memory 64 (FIG. 3).

Figure 5:
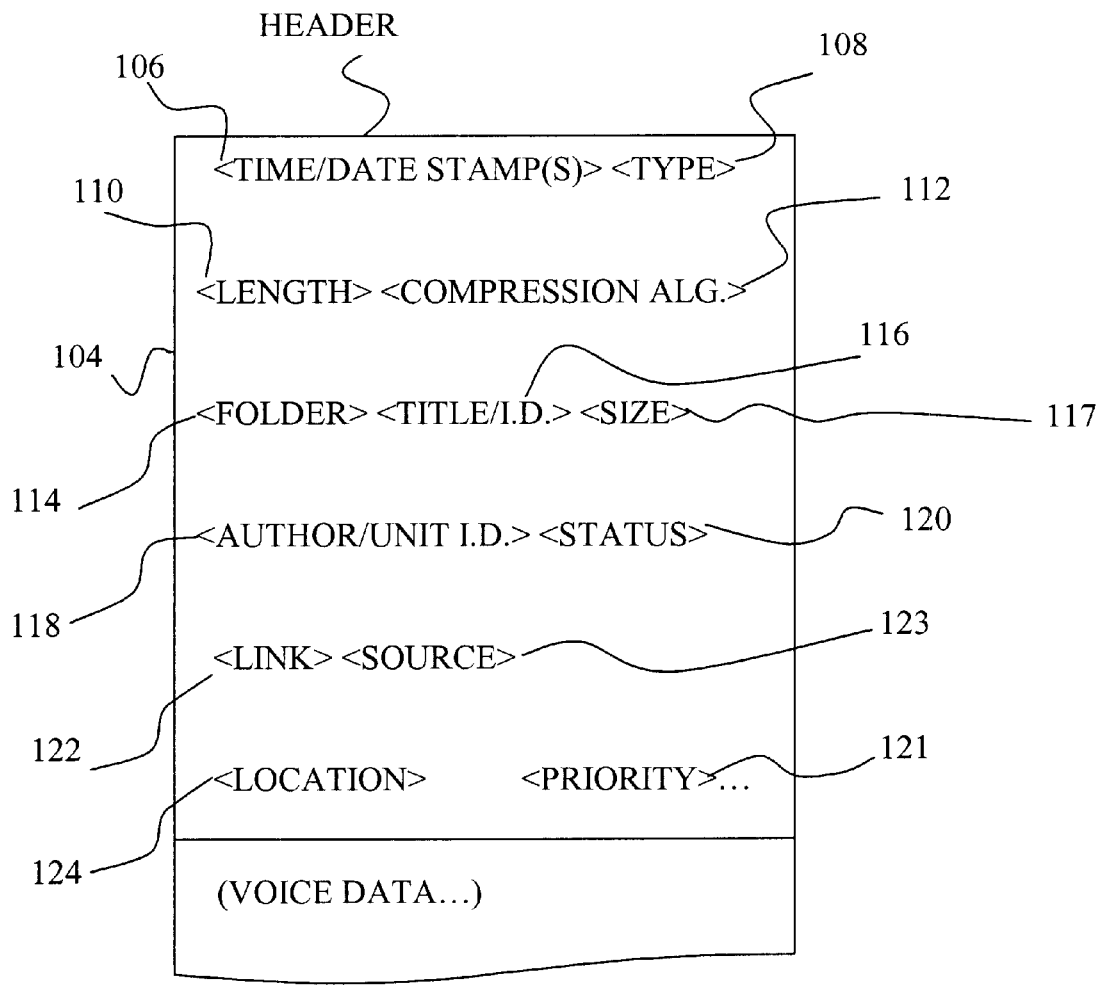
FIG. 5 illustrates a file format, including header data provided in accordance with the invention, for voice data files stored in the portable recorder.

A format for the voice file header data is schematically illustrated in FIG. 5. The header data is generally indicated by reference numeral 104 and includes one or more time and date stamps 106 (corresponding to a time or times at which the voice file was originally recorded or additional voice information was added to the file); data 108 indicating the type of the file (in this case, the type being "voice"); data 110 which indicates the length (in minutes and seconds) of the corresponding voice file; data 112 which indicates the compression algorithm employed with respect to the voice file; data 114 which indicates a "folder" with which the corresponding voice file is associated (it is to be understood that the "folder" may be part of a hierarchical file management and organization system implemented in the recorder); title or other identifying data 116, which indicates a title or other name used to identify the corresponding voice file; "size" data 117 which indicates the number of data words making up the voice file; data 118 which identifies the individual user who created the voice file and the particular portable recorder which was used to create the voice file; "status" data 120, which may indicate, for example, whether the voice file has been completed or is incomplete, data 122 which may be provided to indicate links between the present voice data file and other files, including other voice data files; "source" data 123 which indicates whether the associated voice file was generated internally via the recorder microphone or downloaded from an external source, such as a voice mail system (in this case the source designation would be "internal"); "location" data 124, which identifies an establishment (such as a hospital or a clinic) with which the author is associated and to which the voice file pertains; and a "priority" flag 121, which indicates, in the case of a dictation file, whether it is to be processed on a priority basis after uploading to the PC 16 and/or transfer to central dictation system 28.

It should be understood that the header data format shown in FIG. 5 is only one example of many possible header data formats. The order of the data may be changed, additional header data may be provided, and many of the types of data shown in FIG. 5 may be omitted. In relation to the present invention, it will be understood that key elements of the header data include the author/unit ID data 118 and the location data 124.

According to an alternative preferred embodiment of the invention, the user of the recorder is permitted to define up to six fields of header data which are suitable to the user's particular application. For example, if the recorder is to be used in a medical practice, the six customizable fields may correspond to such items as work type, department, procedure number, location number, medical record number, patient's date of birth. Moreover, in accordance with an aspect of the invention to be described in more detail below, the user may be permitted to select from among a number of different header data formats so that the header format used is one which is most appropriate to the nature or purpose of the respective voice data file.

Referring again to FIG. 4A, steps 130 and 132 follow step 102. At steps 130 and 132, the recording unit (particularly, microprocessor 50) analyzes the characteristics of the utterances stored as the voice data in association with the header data discussed above, to determine whether the characteristics of the utterances match stored characteristics corresponding to previously established users for the recorder unit. It is then determined, at step 134, whether the analyzed voice characteristics meet the stored characteristics of known users. If so, the author data for the corresponding voice file is established as the name of the person whose voice was just recognized (step 136) and that name is then included in the data component 118 of the header data for the voice file (step 138, FIG. 4B).

Referring again to step 134 in FIG. 4A, if the voice of the current user is not recognized, then the recording unit prompts the user, via the touch screen, to input his or her name (step 140) or otherwise to perform a log-in procedure, as by entering a user code or password. If the user does input his or her name (as determined at step 142 in FIG. 4B) or has previously entered his or her name or has logged in, then data identifying the user is included in the data component 18 of the header data for the voice file.

Step 144 follows either step 138, or step 142 if the user's voice was not recognized and no author identifying data was input. At step 144, it is determined whether the recording is complete. Step 146 indicates that recording continues until completed. Although not indicated in the drawing, it should be understood that, in the event that the author data is not provided either by recognizing the user's voice or by data input via the touch screen, the recording unit may operate either to continuously prompt for input of author data, or to intermittently so prompt, or to prompt for input of author data when it is indicated that recording is complete.

Inclusion of data identifying an author of a voice data file in the header data appended to the voice file provides a number of benefits. For example, if use of the portable recording unit is shared, the author-identifying data may be used to aid in indexing the voice data files, so that users may more readily locate their own voice data files (i.e. those which they have created). In addition, if a log-in procedure is provided in the recorder unit, access to voice data files may be controlled so that a voice data file can be accessed only by the author. It should be understood that a log-in procedure may be simplified from the user's point of view by providing that log-in occurs automatically on the basis of the recording unit recognizing the user's voice.

Further benefits of the author-identifying data are realized when voice data files are uploaded from the recorder unit to a personal computer or other device separate from the recorder unit. For example, the author data included in the header data may be displayed by the PC as part of a graphical user interface which indicates the presence of the uploaded voice data file in the PC's memory. The author data may also be read by the PC and used to automatically route the corresponding voice data file to a predetermined destination, such as the personal computer of a transcriptionist who has been assigned to assist the author of the voice data file.

The recorder unit identifying information may also be beneficial in regard to voice data files uploaded to a PC from a recorder unit. For example, if identification of the voice data file's author has not been implemented, the recorder unit number may be used as a surrogate for the author's name. Thus, for example, the PC may read the recorder unit number and, on the basis of previously input data, identify the voice data file as being created by the user assigned to the recorder unit. As another alternative, the PC may use the recorder unit number to automatically forward the voice data file to the transcriptionist assigned to assist the user of the recorder unit or may forward the voice data file to the appropriate dictation system.

As noted briefly above, another aspect of the invention calls for including "location" data in the header data. The location data identifies an establishment at which the author of the voice data file practices his or her occupation. For example, assuming that the user of the recorder is a physician, the location data may identify a hospital or medical clinic from among a plurality of hospitals and/or clinics with which the user is affiliated. The user-physician may carry the recorder with him or her as he or she travels during the course of the working day from one establishment to another, selecting the appropriate location data in regard to each voice data file created during the day. The location data may be used for such purposes as routing the voice data file to the appropriate transcription service or medical records department after the voice data file has been uploaded from the recorder to a PC. In addition, or alternatively, the location data may be used to identify the relevant location to the transcriptionist and/or to direct the transcribed text (in hard copy and/or electronic form) from the transcriptionist to the appropriate establishment.

Figure 6:
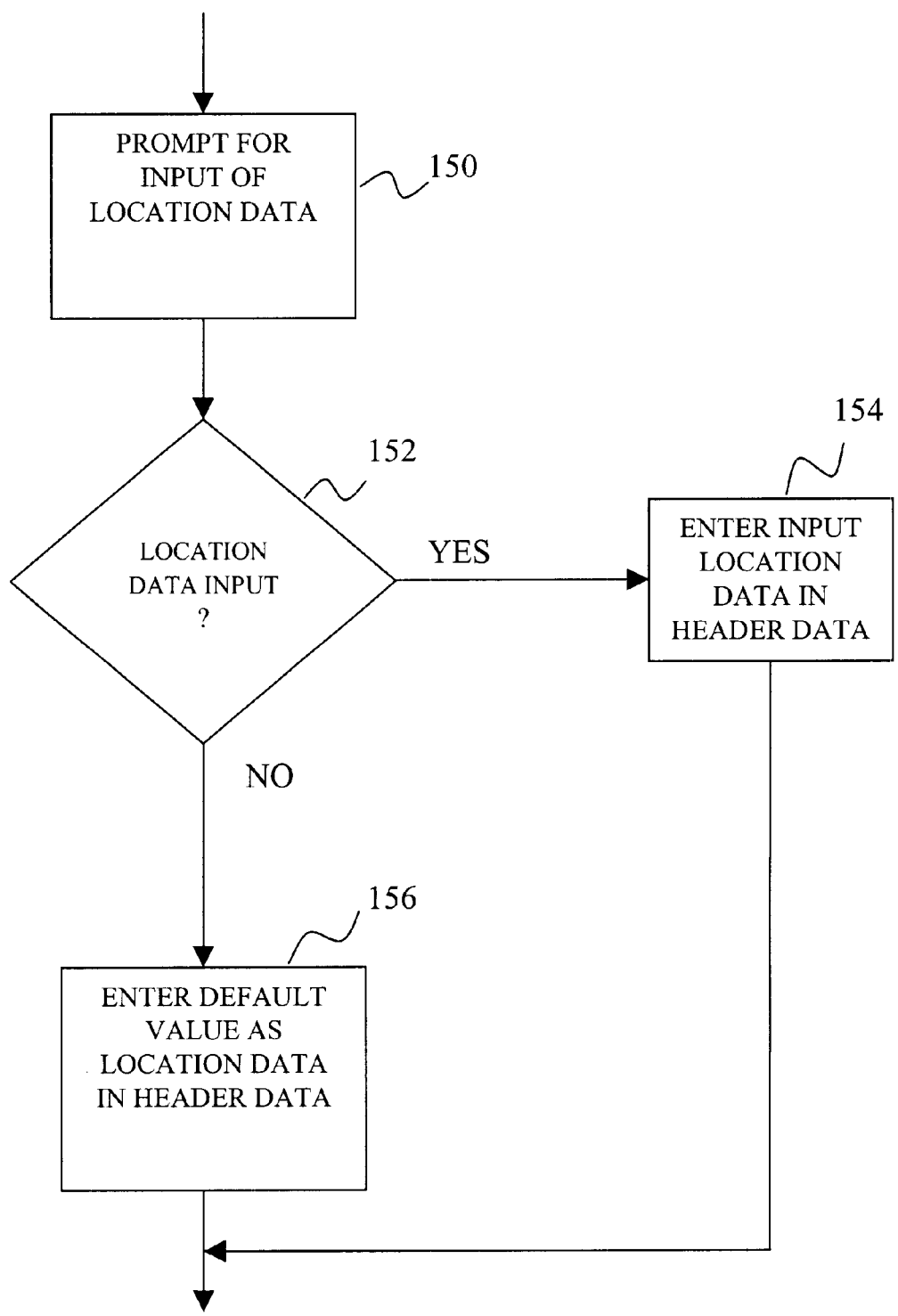
FIGS. 6 and 7 are additional flow charts which illustrate software provided in accordance with the invention to control operation of the portable recorder.

FIG. 6 illustrates additional software steps that may be included in the routine of FIGS. 4A and 4B at the point indicated by reference VI (i.e., immediately before step 144) in FIG. 4B. Referring to FIG. 6, the first step shown therein is step 150. At step 150, the user is prompted to input the appropriate location data pertaining to the subject voice data file. Then, at step 152, it is determined whether the location data has been input. If so, step 154 follows, at which the location data input by the user is included in the header data for the voice data file. It is to be understood that inputting the location data may be accomplished by selecting an appropriate item from a previously-stored list of locations.

If at step 152 it is determined that no location data has been input by the user, then step 156 follows step 152. At step 156 a default value (which may be a null character, or a code representing a previously-selected location) is inserted in the location data field of the header data.

Figure 7:
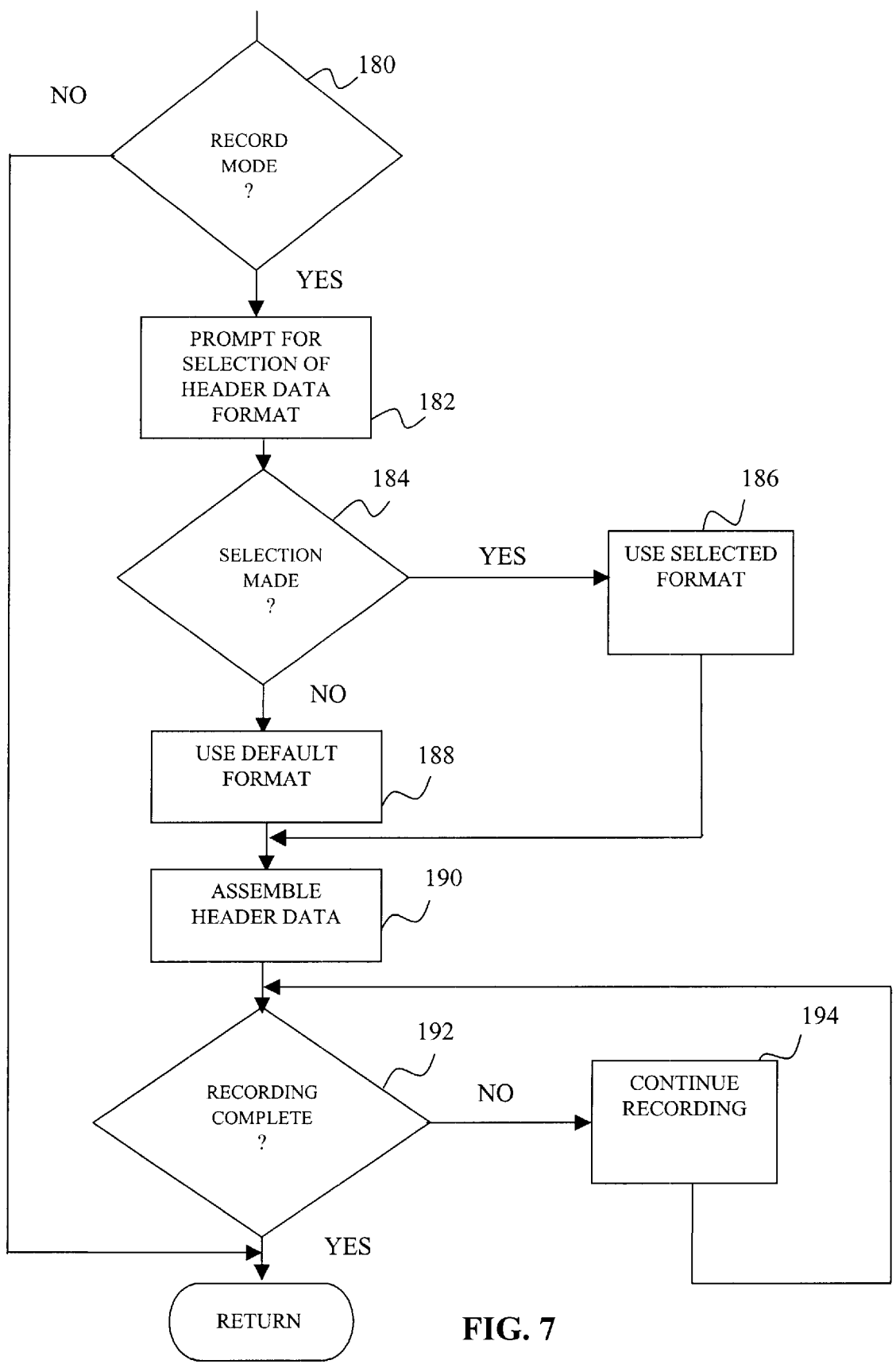

Still another aspect of the invention is illustrated in FIG. 7. According to this aspect, the user of the portable recorder is permitted to select from among a number of different header data formats that have previously been stored in the recorder. The various header data formats stored in the recorder may differ from each other in terms of the number of data fields and/or the respective sizes of the data fields and/or the nature of the data stored in each field.

FIG. 7 illustrates in flow-chart form software which controls the recorder in connection with this aspect of the invention. Initially, at step 180 in FIG. 7, it is determined whether a recording mode is accessed. If so, step 182 follows. At step 182, a new voice data file is created and the user is prompted to select a header data format. Format selection may be accomplished, for example, by selecting on the touch screen 32 a listing (not shown) corresponding to the desired header data format. The selection of the header data format may, alternatively, be made implicitly by selecting another item, such as a setting for the location data field. As another alternative, the most recently selected header data format may be maintained, unless and until the user elects to change the header data format.

Following step 182 is step 184. At step 184 it is determined whether selection of a header data format has occurred. If so, the selected format is used for the header data for the voice data file (step 186). If not, a default format is used (step 188). Following step 186 or step 188, as the case may be, is step 190. At step 190, the header data required to complete the appropriate format is assembled by the recorder. It is to be understood that step 190 may include soliciting appropriate input from the user of the recorder.

Step 192 follows step 190. At step 192, it is determined whether recording is complete. Step 194 indicates that recording continues until completed.

By providing the user of the recorder with various options with respect to the header data format, the user is permitted to select among header data formats that are appropriate for various different types of voice file. Moreover, the user is permitted to select a header data format that is required by the voice data management system of one of a number of different establishments with which the user is affiliated.

According to a preferred manner of carrying out this aspect of the invention, the header format data corresponding to plural formats is stored in the embedded memory 62 (FIG. 3) and the voice data files and associated header data are stored in the removable memory 64. Of course, other arrangements are possible.

Figure 8:
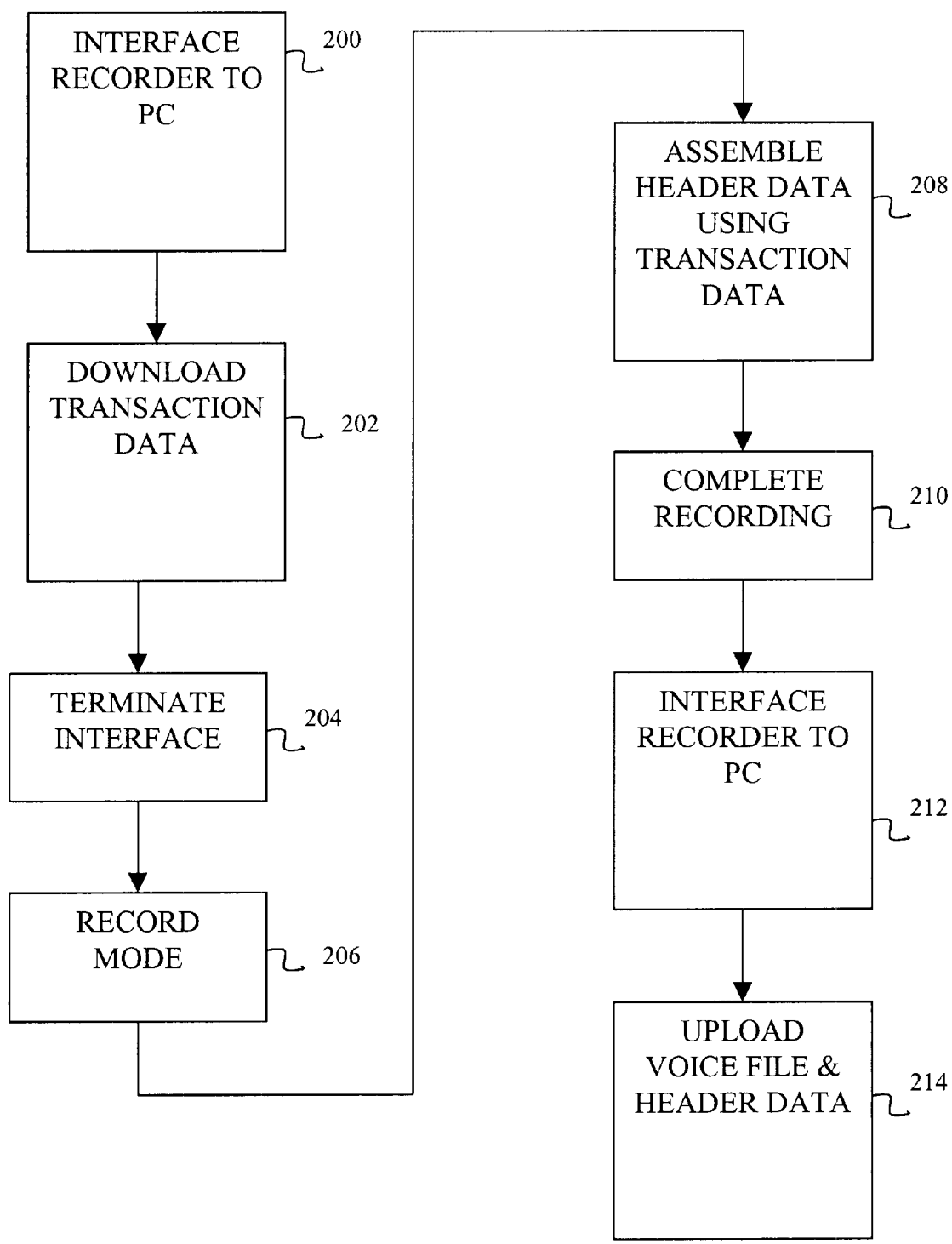
FIG. 8 is a flow chart which illustrates an operation in which transaction data is downloaded from a personal computer to the recorder, and used to generate header data for a voice file which is created in the recorder and then uploaded to the PC, in accordance with the invention.

Still another aspect of the invention is illustrated in FIG. 8. According to this aspect of the invention, data which identifies a specific transaction (e.g., an accident to be investigated, a work order, a particular medical procedure carried out on a given day) is downloaded from the personal computer 16 to the recorder 12, and used to build the header data for a particular voice data file. When the voice data file with the header data is subsequently uploaded to the PC 16, the corresponding voice file (e.g., accident report, parts list, operative report) can be appropriately handled and tracked by the PC 16 and/or other components of the voice data management system.

Referring now to FIG. 8, step 200 therein indicates that the recorder 12 is interfaced to the PC 16 via the cradle 14 and cable 15 to provide a data communication channel between the PC and the recorder. Then at step 202, the transaction data is downloaded from the PC to the recorder. Next, at step 204, the recorder is removed from the cradle, terminating the interface with the PC.

The next step shown is step 206, which represents entering the recording mode of operation of the recorder. Following is step 208, at which header data for the voice data file then being created is established using at least part of the transaction data that was downloaded to the recorder from the PC. It is to be understood that the appropriate transaction data for the voice data file may be accessed by the user of the recorder by appropriate manipulation of the touch screen interface, or by other means, to select from among items of transaction data previously downloaded to and stored in the recorder.

Step 210, which follows step 208, indicates completion of the recording of the voice data file. Then, at step 212, the recorder is again interfaced to the PC, and at step 214 the voice data file and the header data which incorporates the transaction data is uploaded to the PC from the recorder.

It should be noted that the hardware and data communication environment illustrated and described in connection with FIGS. 1–3 may be changed in a number of respects without departing from the invention. For example, substantial changes may be made in the hardware constituting the recorder 12. Among other variations, the touch screen 32 may be omitted in favor of a one or two line character display (not shown). In such a case, additional switches, which may include software-programmable keys, may be added to provide aspects of the user interface. The switches may include a thumbwheel switch to be used for scrolling among menu items. The recorder may also include a key pad and/or a bar code reader. These items may be permanently installed as part of the recorder, or may be provided as one or more optional snap-on modules. The key pad and bar code reader may be employed to enter header data and for other purposes.

In addition to or instead of the cradle-based data link between the recorder 12 and the PC 16, data communication may be established between the recorder and the PC by a wireless RF link and/or infrared data communication. One type of communication that may be used is the well-known IRDA technique. Moreover, the cradle referred to above may be changed to permit serial (e.g. RS-232 or USB) data communication or IR data communication between the PC and the recorder.

It should also be understood that the data communication between the PC 16 and other components of the voice data management system 10 (FIG. 1) may be implemented by connections other than or in addition to the local area network 24 referred to above. Thus, one or more of dial-up telephone data lines, dedicated telephone data channels, a wide area network, and/or wireless data communication may be provided to interconnect system components. The constituents of the voice data management system may be more or fewer in number than those shown in FIG. 1. For example, more than one central dictation system may be connected to the PC 16.

It is to be understood that the above description may indicate to those skilled in the art additional ways in which the principles of this invention may be used without departing from the spirit of the invention. The particularly preferred methods and apparatus are thus intended in an illustrative and not limiting sense. The true spirit and scope of the invention are set forth in the following claims.

What is claimed is:

1. A method of operating a portable digital audio recorder, the method comprising the steps of:

storing a voice data file in a memory device included in the portable digital recorder, said voice data file representing sounds spoken by a user of the recorder;

generating a header data format, wherein said user of the recorder selects or creates header data fields to generate said header data format;

generating header data in conformity with said header data format; and storing said header data in association with the voice data file.

2. The method of claim 1, wherein said header data format is stored in a memory device included in the portable digital recorder.

3. The method of claim 2, wherein said memory device includes a first memory device in which said header data format is stored, and a second memory device in which said voice data file and said header data are stored.

4. The method of claim 3, wherein said first memory device is a flash memory embedded in said recorder, and said second memory device is a flash memory and removably installed in said recorder.

5. The method of claim 1, wherein said memory device is a solid state memory.

6. The method of claim 1, wherein said generating step includes automatically recognizing the user's voice on the basis of the sounds spoken by the user.

7. The method of claim 1, wherein said generating step includes receiving data signals input into the recorder by the user.

8. The method of claim 1, further comprising the step of uploading said voice data file and the associated header data from the recorder to a device separate from the recorder.

9. The method of claim 1, wherein said header data includes data which uniquely identifies the recorder.

10. A method of operating a portable digital audio recorder, the method comprising the steps of:

storing a voice data file in a memory device included in the portable digital recorder, said voice data file representing sounds spoken by a user of the recorder;

downloading transaction data from a personal computer to the recorder, wherein said data identifies a specific transaction;

generating a header data format from said transaction data;

generating header data in accordance with said header data format; and storing said header data in association with the voice data file.

11. The method of claim 10, wherein said header data is generated from said transaction data.

12. The method of claim 11, wherein said header data format is stored in a memory device included in the portable digital recorder.

13. The method of claim 12, wherein said memory device includes a first memory device in which said header data format is stored, and a second memory device in which said voice data file and said header data are stored.

14. The method of claim 13, wherein said first memory device is a flash memory embedded in said recorder, and said second memory device is a flash memory and removably installed in said recorder.

15. The method of claim 10, wherein said memory device is a solid state memory.

16. The method of claim 10, wherein said generating step includes automatically recognizing the user's voice on the basis of the sounds spoken by the user.

17. The method of claim 10, wherein said generating step includes receiving data signals input into the recorder by the user.

18. The method of claim 10, further comprising the step of uploading said voice data file and the associated header data from the recorder to a device separate from the recorder.

19. The method of claim 10, wherein said header data includes data which uniquely identifies the recorder.

* * * * *